US012218028B2

(12) United States Patent
Youssef et al.

(10) Patent No.: US 12,218,028 B2
(45) Date of Patent: Feb. 4, 2025

(54) VENTURI-EFFECT HEAT-TRANSFER DEVICE

(71) Applicants: SAFRAN, Paris (FR); SAFRAN ELECTRONICS & DEFENSE, Paris (FR)

(72) Inventors: Toni Youssef, Moissy-Cramayel (FR); Stéphane Joseph Azzopardi, Moissy-Cramayel (FR); Jean-Christophe Riou, Moissy-Cramayel (FR)

(73) Assignees: SAFRAN, Paris (FR); SAFRAN ELECTRONICS & DEFENSE, Paris (FR)

( * ) Notice: Subject to any disclaimer, the term of this patent is extended or adjusted under 35 U.S.C. 154(b) by 213 days.

(21) Appl. No.: 17/911,348

(22) PCT Filed: Feb. 19, 2021

(86) PCT No.: PCT/FR2021/050302
§ 371 (c)(1),
(2) Date: Sep. 13, 2022

(87) PCT Pub. No.: WO2021/181021
PCT Pub. Date: Sep. 16, 2021

(65) Prior Publication Data
US 2023/0058192 A1    Feb. 23, 2023

(30) Foreign Application Priority Data
Mar. 13, 2020    (FR) ...................................... 2002486

(51) Int. Cl.
*H01L 23/367*    (2006.01)
*F28F 1/16*    (2006.01)
(Continued)

(52) U.S. Cl.
CPC ............ *H01L 23/3677* (2013.01); *F28F 1/16* (2013.01); *F28F 3/02* (2013.01); *F28F 13/08* (2013.01);
(Continued)

(58) Field of Classification Search
CPC .......... H05K 7/20145; H05K 7/20163; H05K 7/20918; H05K 7/209; H01L 23/3677;
(Continued)

(56) References Cited

U.S. PATENT DOCUMENTS 5,351,748 A * 10/1994 Dagan ....................... F28F 3/06
  29/890.044
5,781,411 A *  7/1998 Feenstra ............. H01L 23/3672
  257/713
(Continued)

FOREIGN PATENT DOCUMENTS

DE    102013223461 A1    5/2015
JP    H0529503 A    2/1993
JP    2768063 B2 *    6/1998

OTHER PUBLICATIONS

International Patent Application No. PCT/FR2021/050302, International Search Report and Written Opinion dated Jun. 15, 2021, 7 pgs.
(Continued)

*Primary Examiner* — Zachary Pape
(74) *Attorney, Agent, or Firm* — Cozen O'Connor

(57) ABSTRACT

The invention relates to a device (2) for transferring heat from a thermally conductive plate (30) capable of capturing the heat from a zone placed on a first side (32) of the plate, the device comprising at least one fin (35) placed on a second side (34) of the plate (30) opposite the first side (32) and having a duct (36) extending in a longitudinal direction (L) between a first end (38) connected to the plate and a
(Continued)

second end (40) opposite the first end and which opens out, the duct (36) being connected to at least one Venturi-effect neck (42) bringing cooling air into the duct, the neck (42) being formed in the vicinity of the first end of the duct and the plate (30).

22 Claims, 3 Drawing Sheets

(51) Int. Cl.
| | |
|---|---|
| *F28F 3/02* | (2006.01) |
| *F28F 3/06* | (2006.01) |
| *F28F 13/08* | (2006.01) |
| *H01L 23/373* | (2006.01) |
| *H01L 23/467* | (2006.01) |
| *H05K 7/20* | (2006.01) |
| *F28D 21/00* | (2006.01) |

(52) U.S. Cl.
CPC ........ *H01L 23/3735* (2013.01); *H01L 23/467* (2013.01); *F28D 2021/0029* (2013.01); *F28F 3/022* (2013.01); *F28F 3/06* (2013.01); *F28F 2215/06* (2013.01); *H01L 23/3675* (2013.01); *H05K 7/209* (2013.01)

(58) Field of Classification Search
CPC ...... H01L 23/3675; H01L 23/467; F28F 1/16; F28F 3/02; F28F 3/06; F28F 13/08
See application file for complete search history.

(56) References Cited

U.S. PATENT DOCUMENTS

| | | | | |
|---|---|---|---|---|
| 6,817,405 | B2* | 11/2004 | Kamath | H01L 23/3677 361/689 |
| 6,926,071 | B2* | 8/2005 | Lee | H01L 23/3677 257/E23.105 |
| 6,940,718 | B2* | 9/2005 | Gedamu | H01L 23/3677 257/722 |
| 7,357,173 | B2* | 4/2008 | Griesmayer | H01L 23/3677 257/E23.105 |
| 10,030,863 | B2* | 7/2018 | Pickard | F21V 29/74 |
| 10,297,524 | B2* | 5/2019 | Watanabe | H01L 21/4882 |
| 2016/0341492 | A1 | 11/2016 | Hidemitsu et al. | |
| 2017/0115073 | A1* | 4/2017 | Knox | F28F 21/084 |
| 2021/0296206 | A1* | 9/2021 | Han | C04B 41/4543 |

OTHER PUBLICATIONS

French Patent Application No. 2002486; Search Report dated Feb. 12, 2021; 12 pgs.

* cited by examiner

[Fig. 3]
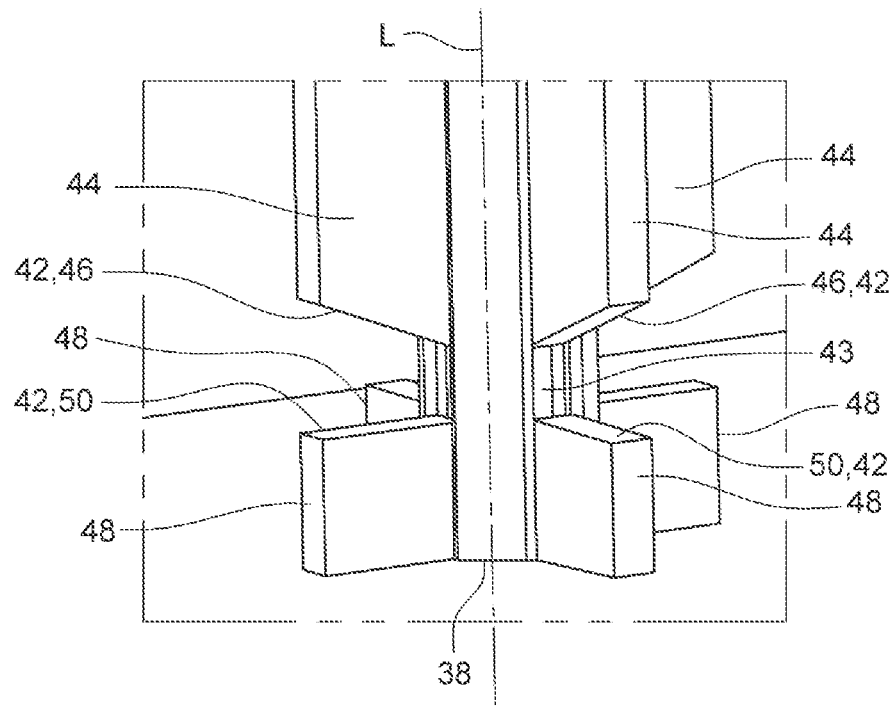
[Fig. 4]
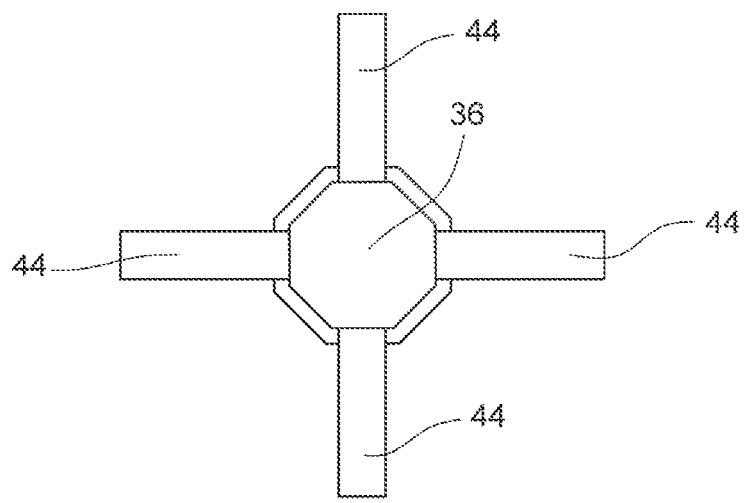

[Fig. 5]
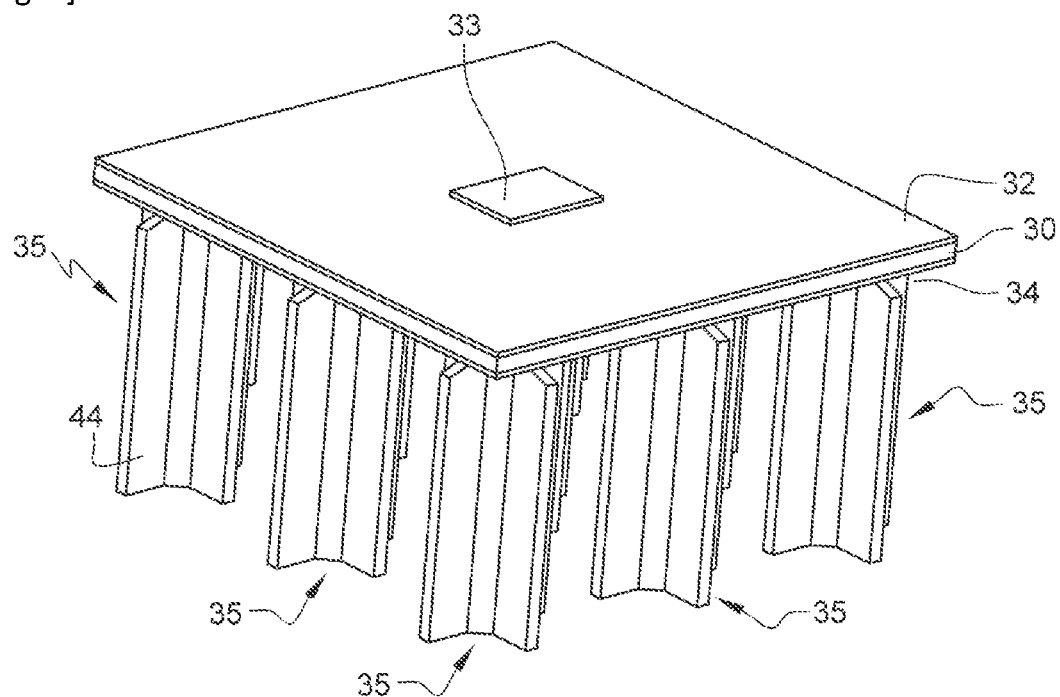
[Fig. 6]
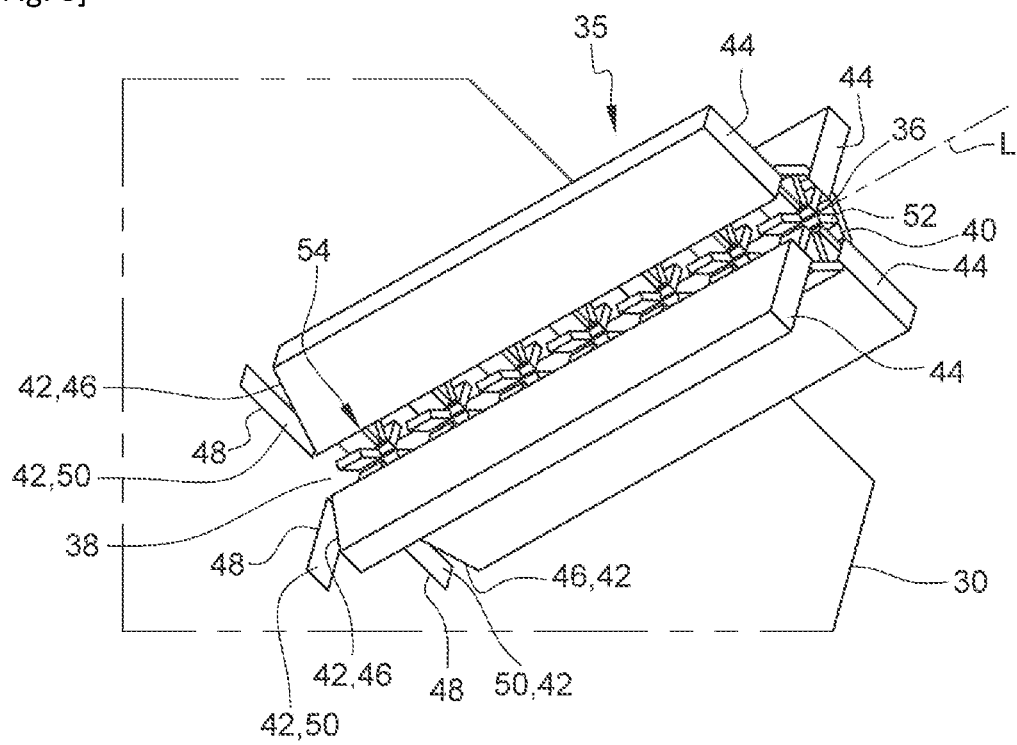

VENTURI-EFFECT HEAT-TRANSFER DEVICE

CROSS-REFERENCE TO RELATED APPLICATIONS

This application is a 35 U.S.C. § 371 filing of International Application No. PCT/FR2021/050302 filed Feb. 19, 2021, which claims the benefit of priority to French Patent Application No. 2002486 filed Mar. 13, 2019, each of which is incorporated herein by reference in its entirety.

TECHNICAL FIELD OF THE INVENTION

This document relates to a device for transferring heat from a thermally conductive plate capable of capturing heat of an area placed on one side of the plate. This type of device can be used for electronic components, power electronic modules, or mechanical systems.

STATE OF THE PRIOR ART

The electronic components, the power electronic modules or certain mechanical systems comprise heat sources within them that it is necessary to cool in order not to damage the material and allow a good operating efficiency. This type of problem is all the more present in the aeronautical field, but is not limited to this field. It is indeed all the more significant in the aeronautical field that the latter presents drastic thermal, mass and volume constraints. Said power electronic modules are, for example, integrated into converters necessary for the electrification of propulsion and non-propulsion systems on-board aircraft in order to convert the electrical energy of the main network in various forms, whether AC/DC, DC/AC, AC/AC or even DC/DC.

The materials and the manner which constitute a power electronic module 2 is known and will thus be described in more detail, although the cooling necessary for its operation is not limited solely to this type of system. A power electronic module 2 comprises, as illustrated in FIG. 1, several elements and first of all, a heat source carried out by means of a power semiconductor component 4. A wiring, preferably a wire 6, ensures the electrical connections between the different portions of the power semiconductor component. This power semiconductor component is then transferred onto a substrate 8 and, more specifically, to a first metal interconnection interface 10 of said substrate 8. This substrate 8 is manufactured using different techniques such as the methods known as "Direct Bonded Copper" (DBC), "Active Metal Brazing" (AMB) or "Direct Bonded Aluminum" (DBA). Thus, such a substrate 8 generally consists of an electrically insulating ceramic 12 between two metal elements 14 and 16, each of them allowing creating a first metal interconnection interface 10 and a second metal interconnection interface 11. Said substrate 8 thus allowing carrying out the interconnections between, on the one hand, said power semiconductor components 4 and the external circuit by means of a first metal interconnection interface 10 belonging to the first metal element 14, and on the other hand, a soldered joint 18 thanks to a second metal interconnection interface 11 belonging to the second metal element 16. In order to be more accurate concerning the interconnection with the external circuit, external connectors, also called connectors 20, are attached by solders 19 on the first metal interconnection interface 11 of the first metal element of said substrate. These external connectors 20 thus ensure the electrical contacts with the external electrical circuits.

Furthermore, said soldered joint 18, connected to the second metal interconnection interface 11, allows transferring the substrate 8 onto a flange 22, thus carrying out a third interconnection interface 24. The role of the flange 22 is to spread the thermal flow and to ensure a mechanical connection with the cooling system. This flange is, for example, made of copper Cu, Aluminum Al, or aluminum composite—silicon carbide AlSiC. The thermal contact resistance between said flange 22 and the cooling system is reduced in order to ensure a better discharge of the thermal flow thanks to a thermal interface material, whether it is, for example, thermal grease, an elastomeric film or even a phase change material. Finally, a plastic casing 26, for example, is used in order to mechanically protect a portion of the power electronic module 2. Alternatively to the plastic casing 26, a metal casing 26 can also be used in order to serve as a diffusion barrier and electromagnetic shielding. The vacuum in the casing is filled with an insulator, for example of the silicone gel type, encapsulating all constituents located inside the casing.

In general, devices for cooling, or in other words for transferring heat, are used to improve the thermal conduction thanks to a contact with the heat source. This type of device is optimised by increasing the exchange surface with a colder fluid, for example a liquid or air.

More commonly, a ventilation system (hydraulic pump or electric fan) is used to discharge heat by forcing the convection. This type of system consists of heat pipe systems. The heat is thus taken from the heat source and is returned to the ends of the heat pipes. Said heat pipe passes through a fin radiator which is in turn ventilated by an electric fan.

A power electronic module is known which comprises a device for transferring heat having the shape of a fractal. Said device is designed on the face of the system to be cooled. The desired effect is to increase the heat exchange coefficient in order to increase the exchange surface with the air.

Devices for transferring heat from a hot source are also known, consisting of micro-channels which can also form a fin attached to the flange of the power electronic module and whose micro-channels are oriented parallel to said flange.

However, the complexity of the geometry and the multitude of used systems such as the fins, the channels/heat pipe, fan, etc. make the system expensive.

This document aims at overcoming these drawbacks in a simple, reliable and inexpensive manner.

Disclosure of the Invention

A device for transferring heat comprising a thermally conductive plate capable of capturing the heat from a zone placed on a first side of the plate, at least one fin placed on a second side of said plate opposite to the first side and including a conduit extending in a longitudinal direction between a first end connected to said plate and a second end opposite to the first end and which opens out, said conduit being connected to at least one Venturi-effect neck for supplying cooling air into the conduit, said Venturi-effect neck being formed in the vicinity of the first end of said conduit and of said plate.

The device allows increasing the heat transfer, that is to say the transfer of heat originating from the first side of the zone of the plate relative to a device of the prior art. In particular, the conformation of the fin with a conduit connected to a Venturi-effect neck allows cold air to be sucked into the conduit. More particularly, this results from the combination of three physical effects within the fin according to the present document, namely the fact that the hot air tends to rise and that this rise of hot air induces a suction of replacement cold air by the neck and that finally the neck shaped to allow the generation of a Venturi effect performs an acceleration of the air at the inlet of the conduit.

By making said device in this manner, the geometry of this device facilitates the entry of the cold air through said Venturi-effect neck and the discharge of hot air from the top of the second end of said conduit. This phenomenon is all the more facilitated by the fact that hot air, of lower density than cold air, rises.

A more detailed explanation of these principles is given in the detailed description.

Relative to the prior art, it allows reducing the use of fans which increase the cost and space requirement of such a device. Indeed, it is no longer necessary to use an electrical or hydraulic ventilation system nearby as is in particular the case in the prior art. As a result, a self-regulation takes place and heat is discharged quickly and efficiently.

The term "in the vicinity" indicates that the neck is formed so as to allow a circulation of fresh air and its supply into the conduit in the vicinity of the hot plate.

Thus, the heat transfer efficiency of the device with equivalent compactness is improved relative to the prior art due to the integration of a fin shaped specifically as indicated above. According to another feature, said fin may comprise one first wall element extending laterally from said conduit and along the latter. Such a first wall element carries out a similar function of conducting heat from the plate into the conduit and into the first wall element which is connected thereto. The presence of at least one wall element further allows improving the transfer of heat of the air from the conduit to the outside by thermal conduction.

In a particular embodiment, each first wall element can extend to the second end of said conduit.

Each first wall element may comprise a first face forming, with a second opposite face, said Venturi-effect neck. Thus, the end of the first face of the first wall element is used to form a portion of the Venturi-effect neck.

At least one second wall element can be formed in contact with the plate and carrying said second face. Thus, a second wall element is added which can further improve the heat condition of the plate to the outside. The compactness is improved by the integration of the Venturi-effect neck between the first wall element and the second wall element. It is understood that the wall element can be annular and surround the conduit about the longitudinal axis.

Each first wall element may be associated with a second distinct wall element extending laterally from the conduit, each second wall element comprising said second face. In this configuration, the fin comprises a plurality of first wall elements and second wall elements, each first wall element being associated with a second wall element. The first wall elements and the second wall elements can be evenly distributed about the longitudinal axis of the conduit.

The conduit may have the shape of cylinder which may be a straight cylinder, that is to say having a base with a closed contour and whose directrices are parallel to each other and perpendicular to the base. Preferably, the directrix of the cylinder is perpendicular to the plate. The greatest width inside the conduit in a direction perpendicular to the longitudinal direction is comprised between 5 and 20 mm, preferably in the order of 20 mm.

Said Venturi-effect neck can open out at an orifice of the conduit, this orifice having a length in the longitudinal direction which is comprised between 0.1 and 1.5 mm, and a width in a perpendicular direction comprised between 0.1 and 1 mm.

In a plane containing the longitudinal direction and passing through said first face and said second face, the angle between said first face and said second face measured in this plane is comprised between 0 and 45°.

The dimension of the second wall element in the longitudinal direction can be strictly greater than 0 and less than or equal to 0.05 mm.

The dimension of the first wall element in a direction perpendicular to the longitudinal direction is comprised between 3 mm and 10 mm.

The dimension of the second wall element in a direction perpendicular to the longitudinal direction is comprised between 3 mm and 10 mm.

The dimension of the conduit in the longitudinal direction is comprised between 10 and 30 mm.

Said fin comprises at least one blade extending projectingly inside the conduit.

Said fin may comprise a plurality of annular rows of blades spaced longitudinally from each other.

The presence of one or more blades allows creating turbulence in the hot air rising from the first end of the conduit towards the second open end thereof, thus promoting convection. The blades of each annular row can extend radially and are evenly distributed about the longitudinal axis.

The device may comprise a plurality of fins of the aforementioned type. These fins can be distributed on the second side of the plate, that is to say on a second face opposite to the first face arranged in the first zone.

Said plate may comprise a metallized ceramic substrate.

The present document also relates to an assembly comprising a device as described above, wherein a power electronic module is applied on said first side of said plate. Thus, the plate comprising a first face and a second face, the first face receives the power electronic module which will dissipate heat in operation and the second face of the plate will allow the generated heat to be transferred to the outside by means of the devices of the present document.

The document also relates to a method for installing a previously described device, wherein said device is oriented so that said second end of said conduit is oriented upwards. Preferably, the conduit is oriented vertically with the second upwardly oriented end.

BRIEF DESCRIPTION OF THE FIGURES

FIG. 3 is an enlarged view of the embodiment illustrated in FIG. 2, FIG. 4 is a top view of the embodiment illustrated in FIG. 2, FIG. 5 is a second embodiment of a device for transferring heat according to the invention, FIG. 6 is a third embodiment of a device for transferring heat according to the invention.

DETAILED DESCRIPTION OF THE INVENTION

The present document describes a device for transferring heat from a thermally conductive plate capable of capturing heat from an area placed on one side of said plate. This type of device can be used, for example, for electronic components, power electronic modules, or mechanical systems, but is not only limited to this type of system. The present document finds particular application in the field of aeronautics where the thermal, mass and volume constraints are significant. However, this is not limited to this single field and can be used equally well in other domains such as automotive, data centres and wind energy, railways, surface buildings and submarines.

Said device for transferring heat from at least one heat source is based on three physical phenomena. The first is a physical observation which is that the hot air tends to rise upwards because it has a lower density than cold air. By way of example, the cold air at 10° C. has a density of 1.247 kg/m³ while at 85° C., the density of said hot air has a density of 0.986 kg/m³. The second physical phenomenon can be illustrated by the phenomenon occurring, for example, in a chimney. Indeed, in a chimney, the thermodynamic movement of the hot air, previously specified, causes the hot air which rises in the chimney flue to be replaced by a cold air coming in this particular case from the room in which the said chimney is located. This therefore generates a convection movement. The last physical phenomenon is that discovered by the Italian physicist Giovanni Battista Venturi, relying on Bernoulli's theorem. Venturi has shown that when the flow rate of a fluid is constant and the diameter of the container of said fluid decreases, then the speed of the fluid increases. In addition, the pressure in the container before the restriction is lower than at the level of the restriction: there is formation of a negative pressure. Indeed, in this type of configuration, there is equality between the energy per unit volume before the restriction and the energy per unit volume just after the container diameter restriction. The equation governing this phenomenon is then:

$$P_1 + \frac{1}{2}\rho v_1^2 + \rho g h_1 = P_2 + \frac{1}{2}\rho v_2^2 + \rho g h_2$$

With, in the zone before the restriction, $P_1$ the pressure in the container before the restriction, the term $\frac{1}{2}\rho v_1^2$ corresponding to the kinetic energy per unit volume of which $\rho$ designates the density of the fluid and $v_1$ designates the speed of said fluid, and the term $\rho g h_1$ corresponds to the potential energy per unit volume with g the acceleration due to gravity and h the height. Analogously, the terms on the right of the equation designating the energy per unit volume after the restriction designate the same notions.

Figure 1:
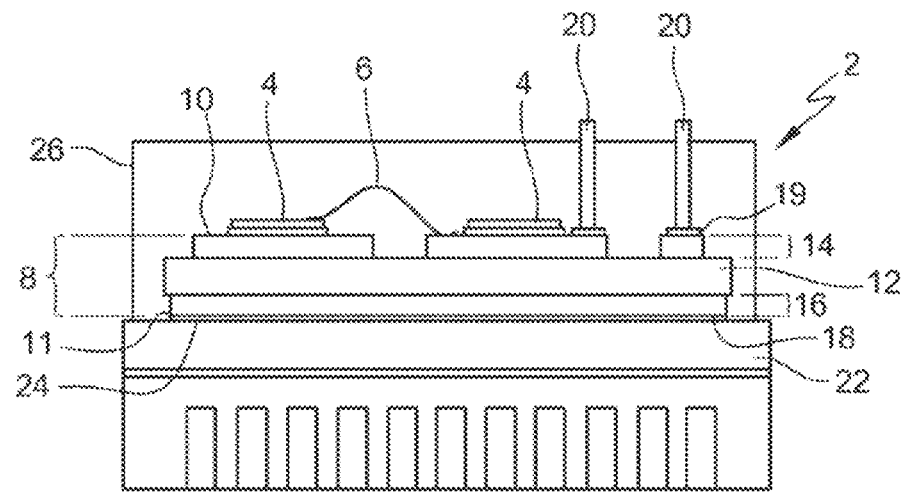
FIG. 1 is a power electronic module according to the prior art.
Figure 2:
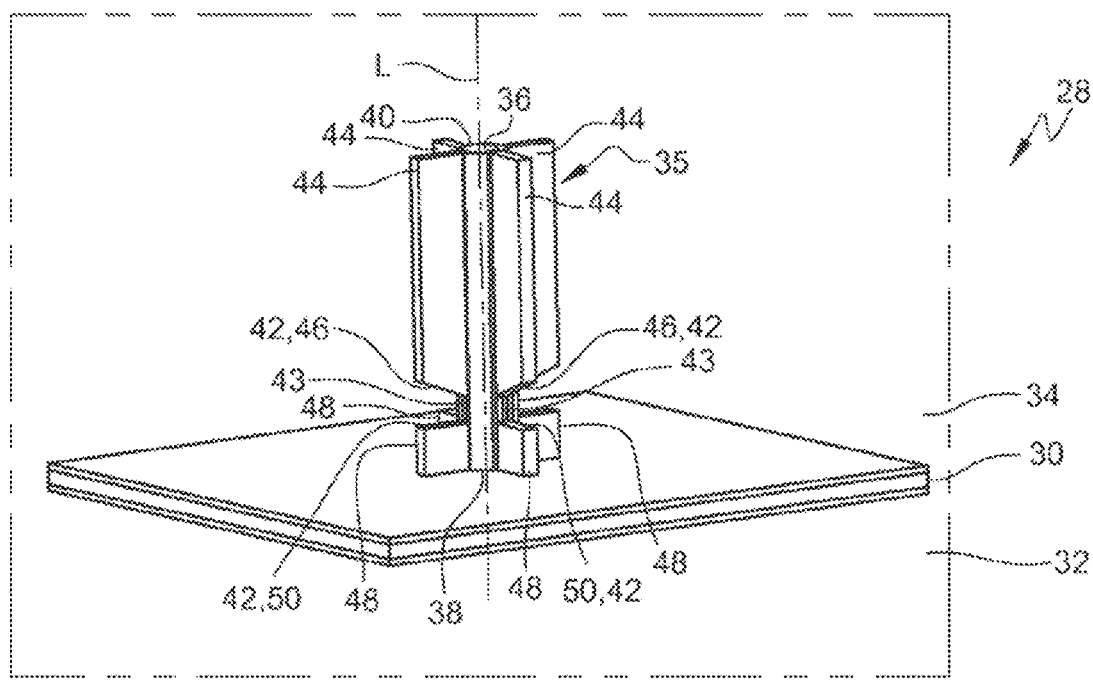
FIG. 2 is an embodiment of a device for transferring heat according to the invention.

A first embodiment, illustrated in FIGS. 2, 3 and 4, consists of a device for transferring heat 28 from a thermally conductive plate 30 capable of capturing heat of a zone placed on a first side 32 of the plate 30, said device comprising at least one fin 35 placed on a second side 34 of said plate 30 opposite to the first side 32 and including a conduit 36 extending in a longitudinal direction L between a first end 38 connected to said plate 30 and a second end 40 opposite to the first end 38 and which opens out, said conduit 36 being connected to at least one Venturi-effect neck 42 for supplying cooling air into the conduit 36, said neck 42 being formed in the vicinity of the first end 40 of said conduit 36 and of said plate 30.

Thus, said device for transferring heat 28 comprises a fin 35 which is extruded on a conduit 36 which conveys, within it, hot air originating from at least one zone placed on the first side of the plate. Said at least one zone placed on the first side 32 of the plate 30 can be electrically and/or thermally insulated from said heat transfer device 28 by adding an insulating material. This fin is placed on a metallized ceramic substrate like those, for example, used for the power electronic modules. In this embodiment, the used substrate is a DBA substrate which has a surface area of 40×40 mm² and consists of least 3 layers: 0.4 mm of aluminium, 1 mm of aluminium composite and 0.4 mm of aluminium.

The fin comprises at least four first wall elements 44 extending laterally from said conduit 36, along the length of the conduit in the longitudinal direction L and evenly distributed around the longitudinal direction. Said first wall elements extend to the second end of said conduit. Each of these first wall elements comprises a first face 46 forming, with a second opposite face 50, said Venturi-effect neck.

Said device comprises four second wall elements 48 formed in contact with the plate 30 and carrying said second face 50. Each first wall element 44 is associated with a second distinct wall element 48 extending laterally from the duct, each second wall element comprising a second face.

The four first wall elements 44 associated with the four second wall elements 48 are in contact with a colder air from the outside environment. This cold air can originate for example from the ambient air or from at least one fan which is distant or close to said device. A fan is placed with a flow rate of 0.01 m³/s and is disposed 1 m from the device for transferring heat. In other words, this means that said zone 33, placed on the first side 32 of said plate, receives a loss of 10 W.

The dimensioning of the geometry of said fin has been optimised thanks in particular to thermodynamic modelling so as to obtain the dimensioning such that said device for transferring heat is the most efficient and therefore reduces the temperature in the vicinity of the heat source as much as possible.

Thus, the dimension of the conduit in the longitudinal direction is comprised between 10 and 30 mm, for example 20 mm and the greatest width inside the conduit in a direction perpendicular to the longitudinal direction is comprised between 5 and 20, for example 20 mm. Said conduit has the shape of a straight cylinder with a hexagonal base.

The dimension of the first and second wall elements in a direction perpendicular to the longitudinal direction is comprised respectively between 3 and 10 mm, for example 3.5 mm.

A parametric study of the shape of said Venturi-effect neck has been performed and allowed determining the most efficient dimensioning. Thus, said Venturi-effect neck opening out at an orifice 43 of the conduit 36, this orifice having a length in the longitudinal direction which is comprised between 0.1 and 1.5 mm, for example 0.1 mm, and a width in a perpendicular direction comprised between 0.1 and 1 mm, for example 1 mm. The longitudinal direction and the perpendicular direction belong to the same plane perpendicular to the incoming air flow through orifice 43 into conduit 36. Furthermore, a plane containing the longitudinal direction and passing through said first face and said second face, the angle between said first face and said second face measured in this plane is comprised between 0° and 45°, for example between 20° and 45°. The dimension of said second wall element in the longitudinal direction is strictly greater than 0 and less than or equal to 0.05 mm.

In the absence of a device for transferring heat, the maximum temperature measured in the power electronic module is 148° C. Advantageously, thanks to said heat transfer device comprising a fin, the temperature is lowered to 85.6° C.

According to another embodiment, said device for transferring heat may comprise a plurality of fins 35 of the aforementioned type as illustrated in FIG. 5. According to this embodiment, said fins 35 are regularly spaced but may also not be. In this case, thanks to this arrangement, the temperature is lowered to 82.86° C.

According to another embodiment illustrated in FIG. 6, the device for transferring heat is differentiated from that described in FIGS. 2, 3 and 4 in that said fin 35 comprises eight blades 52 extending projectingly inside the conduit 36. These blades 52 disturb the flow of a cooling fluid circulating inside said conduit 36, creating a non-laminar flow in the conduit 36. This fin 35 comprises seven annular rows of blades spaced longitudinally from each other. These blades 52 extend radially and are evenly distributed about the longitudinal axis L.

The number of blades 52 and annular rows 54 is not limiting and said device for transferring heat can comprise at least one blade 52 and at least one annular row 54, but can also comprise a plurality of blades and annular rows 54. Finally, said device for transferring heat may comprise a plurality of fins 35.

According to another embodiment, the conduit may also have the shape of a straight cylinder or of a straight cylinder with a circular base. The number of first wall element 44 and second wall element 48 of said fin is not limiting and fin 35 may comprise a first single wall element 44 or a plurality of first wall elements 44 or a first element of wall 44 associated with a second wall element 48 or a plurality of first wall elements 44 associated with a plurality of second wall element 48.

The invention claimed is:

1. A device (2) for transferring heat comprising:
   a thermally conductive plate (30) capable of capturing the heat from a zone placed on a first side (32) of the plate (30),
   at least one fin (35) placed on a second side (34) of said plate (30) opposite to the first side (32), said at least one fin including:
      a conduit (36) extending in a longitudinal direction (L) between a first end (38) connected to said plate and a second end (40) opposite to the first end and which opens out,
      a plurality of wall elements extending laterally from said conduit and forming at least one Venturi-effect neck (42) for supplying cooling air into the conduit through at least one orifice in the conduit, said Venturi-effect neck (42) being formed in the vicinity of the first end of said conduit and of said plate.

2. The device according to claim 1, wherein said plurality of wall elements comprises at least one first wall element (44) extending laterally from said conduit (36) and along the length of said conduit (36) in the longitudinal direction (L).

3. The device according to claim 2, wherein each first wall element (44) extends to the second end of said conduit (36).

4. The device according to claim 2, wherein the dimension of each first wall element (44) in a direction perpendicular to the longitudinal direction (L) is comprised between 3 mm and 10 mm.

5. The device according to claim 3, wherein each first wall element (44) comprises a first face (46) forming, with a second opposite face (50), said Venturi-effect neck (42).

6. The device according to claim 5, wherein the plurality of wall elements comprises at least one second wall element (48) formed in contact with the plate and carrying said second face (50).

7. The device according to claim 5, wherein, in a plane containing the longitudinal direction (L) and passing through said first face (46) and said second face (50), the angle between said first face (46) and said second face (50) measured in this plane is comprised between 0 and 45°.

8. The device according to claim 6, wherein each first wall element (44) is associated with a second distinct wall element (48) extending laterally from the conduit (36), each second wall element (48) comprising said second face (50).

9. The device according to claim 6, wherein the dimension of the at least one second wall element (48) in the longitudinal direction (L) is strictly greater than 0 and less than or equal to 0.05 mm.

10. The device according to claim 6, wherein the dimension of each second wall element (48) in a direction perpendicular to the longitudinal direction is comprised between 3 mm and 10 mm.

11. The device according to claim 1, wherein the plurality of wall elements comprises a plurality of first wall elements (44) that are regularly distributed around the longitudinal direction (L).

12. The device according to claim 1, wherein the conduit (36) has the shape of a straight cylinder.

13. The device according to claim 12, wherein the greatest width inside the conduit (36) in a direction perpendicular to the longitudinal direction (L) is comprised between 5 and 20 mm.

14. The device according to claim 1, wherein said Venturi-effect neck (42) opens out at an orifice (43) of the conduit (36), this orifice (43) having a length in the longitudinal direction (L) which is comprised between 0.1 and 1.5 mm, and a width in a perpendicular direction comprised between 0.1 and 1 mm.

15. The device according to claim 1, wherein the dimension of the conduit (36) in the longitudinal direction (L) is comprised between 10 and 30 mm.

16. The device according to claim 1, wherein said fin (35) comprises at least one blade (52) extending projectingly inside the conduit (36).

17. The device according to claim 16, wherein said fin (35) comprises a plurality of annular rows of blades (52) spaced longitudinally from each other.

18. The device according to claim 17, wherein said blades (52) of each annular row extend radially and are regularly distributed about the longitudinal axis.

19. The device according to claim 1, comprising a plurality of fins (35).

20. The device according to claim 1, wherein said plate (30) comprises a metallized ceramic substrate.

21. An assembly comprising the device according to claim 1, wherein a power electronic module (2) is applied on said first side of said plate (30).

22. A method for installing the device according to claim 1, wherein said device is oriented so that said second end (40) of said conduit (36) is upwards.

* * * * *